(12) United States Patent
Valdes Chavez et al.

(10) Patent No.: US 11,913,977 B2
(45) Date of Patent: Feb. 27, 2024

(54) POSITIVE TEMPERATURE COEFFICIENT RESISTOR HEATER ASSEMBLY HEALTH MONITORING

(71) Applicant: Rosemount Aerospace Inc., Burnsville, MN (US)

(72) Inventors: Armando Valdes Chavez, Lakeville, MN (US); Richard Alan Schwartz, Faribault, MN (US); Alexandra C. Jenkins, Prior Lake, MN (US)

(73) Assignee: Rosemount Aerospace Inc., Burnsville, MN (US)

( * ) Notice: Subject to any disclaimer, the term of this patent is extended or adjusted under 35 U.S.C. 154(b) by 463 days.

(21) Appl. No.: 17/322,251

(22) Filed: May 17, 2021

(65) Prior Publication Data
US 2022/0365115 A1    Nov. 17, 2022

(51) Int. Cl.
*G01R 19/12*    (2006.01)
*B64D 45/00*    (2006.01)
*H05B 3/00*    (2006.01)

(52) U.S. Cl.
CPC .............. *G01R 19/12* (2013.01); *B64D 45/00* (2013.01); *H05B 3/0014* (2013.01); *B64D 2045/0085* (2013.01); *H05B 2203/007* (2013.01); *H05B 2203/02* (2013.01)

(58) Field of Classification Search
CPC ................... G01R 19/12; B64D 45/00; B64D 2045/0085; H04B 3/0014; H04B 3/00; H04B 2203/007; H04B 2203/02
See application file for complete search history.

(56) References Cited

U.S. PATENT DOCUMENTS

| 4,121,088 | A | 10/1978 | Doremus et al. |
| 2018/0275183 | A1* | 9/2018 | Essawy .............. H05B 1/0236 |
| 2019/0297675 | A1 | 9/2019 | Vadgaonkar et al. |
| 2020/0072866 | A1 | 3/2020 | Gordon et al. |
| 2020/0391871 | A1* | 12/2020 | Essawy ................. G01P 5/165 |

FOREIGN PATENT DOCUMENTS

EP    1385073 B1    9/2011

OTHER PUBLICATIONS

Extended European Search Report for European Patent Application No. 22173576.4, dated Oct. 31, 2022, 5 pages.

* cited by examiner

*Primary Examiner* — Manuel L Barbee
(74) *Attorney, Agent, or Firm* — Kinney & Lange, P.A.

(57) ABSTRACT

A system for determining a health status of a positive temperature coefficient resistor (PTCR) heater assembly includes a PTCR heater assembly and a health monitoring system. An input voltage is provided to the PTCR heater assembly to provide heating. The health monitoring system includes a first sensor configured to sense the input voltage at the PTCR heater assembly and a second sensor configured to sense a current through the PTCR heater assembly. The health monitoring system is configured to determine a baseline characteristic and an observed characteristic each relating to an inrush peak of the PTCR heater assembly and based on the input voltage and the current. The health monitoring system compares the observed characteristic to the baseline characteristic to assess a health status of the PTCR heater assembly and outputs the health status for PTCR heater assembly diagnostics and/or prognostics.

20 Claims, 6 Drawing Sheets

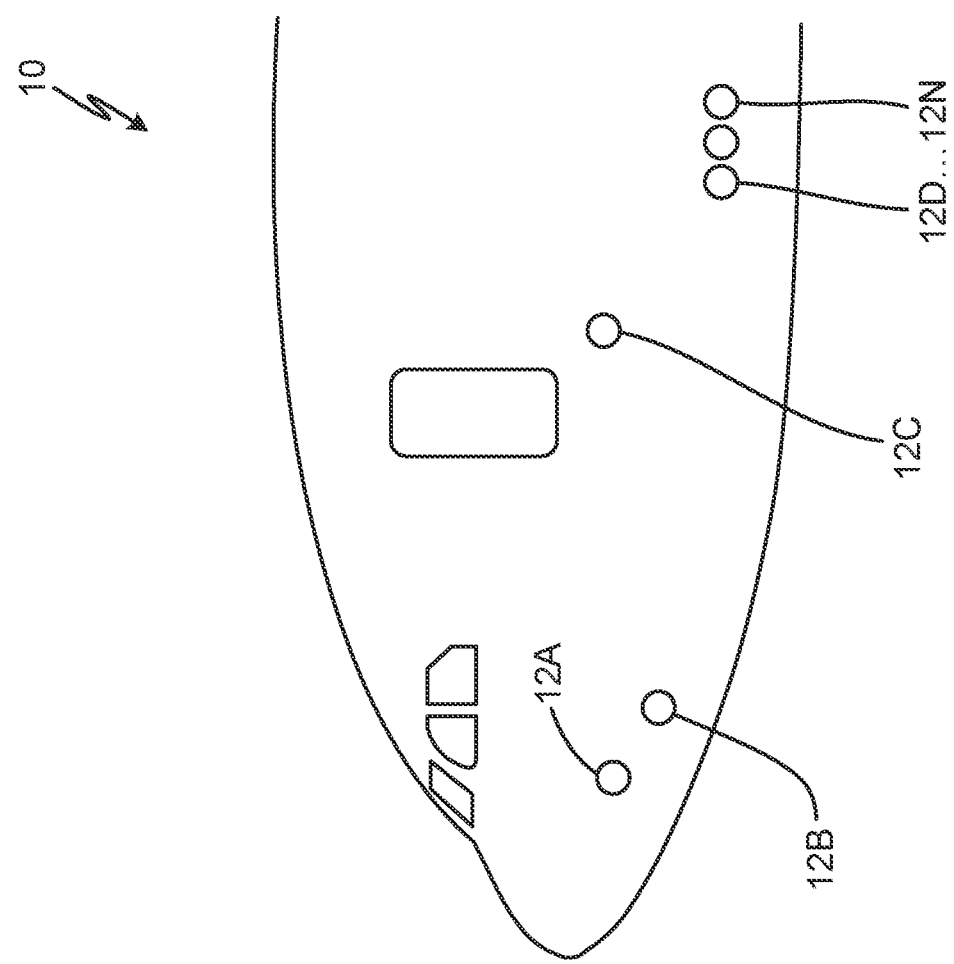

POSITIVE TEMPERATURE COEFFICIENT RESISTOR HEATER ASSEMBLY HEALTH MONITORING

BACKGROUND

This disclosure relates generally to air data probes, and, more specifically, to heaters for air data probes.

Air data probes are utilized to determine characteristics of an environment. In aircraft systems, for example, air data probes may be implemented on external portions of the aircraft to aid in determination of conditions such as airspeed, altitude, angle of attack, and flight direction, among others. Due to the harsh conditions of flight, ice may build up on portions of an air data probe or liquid water trapped internally may freeze. To combat this, electric heaters are implemented within the air data probe to prevent the formation of ice that may impact proper functionality of the probe. One type of heating element that can be implemented in an air data probe is a positive temperature coefficient resistor (PTCR) heater. A characteristic of PTCR heaters is that the resistivity increases rapidly with increasing temperature; thus, PTCR heaters can be considered self-regulating.

Heating elements are integral to air data probe functionality. When heating elements degrade, air data probes need to be replaced.

SUMMARY

In one example, a system for determining a health status of a positive temperature coefficient resistor (PTCR) heater assembly includes a PTCR heater assembly and a health monitoring system. An input voltage is provided to the PTCR heater assembly to provide heating. The health monitoring system includes a first sensor configured to sense the input voltage at the PTCR heater assembly and a second sensor configured to sense a current through the PTCR heater assembly. The health monitoring system is configured to determine a baseline characteristic and an observed characteristic each relating to a startup profile of the PTCR heater assembly and based on the input voltage and the current. The health monitoring system compares the observed characteristic to the baseline characteristic to assess a health status of the PTCR heater assembly and outputs the health status for PTCR heater assembly diagnostics and/or prognostics.

In another example, a system for an aircraft includes an air data probe that includes a positive temperature coefficient resistor (PTCR) heater assembly and a health monitoring system. An input voltage is provided to the PTCR heater assembly to provide heating for the air data probe. The health monitoring system includes a first sensor configured to sense the input voltage at the PTCR heater assembly and a second sensor configured to sense a current through the PTCR heater assembly. The health monitoring system is configured to determine a baseline characteristic and an observed characteristic each relating to an inrush peak of the PTCR heater assembly and based on the input voltage and the current. The health monitoring system compares the observed characteristic to the baseline characteristic to assess a health status of the PTCR heater assembly and outputs the health status for PTCR heater assembly diagnostics and/or prognostics.

In another example, a method for determining a health status of a positive temperature coefficient resistor (PTCR) heater assembly includes providing an input voltage to the PTCR heater assembly. The method further includes sensing the input voltage at and a current through the PTCR heater assembly; determining a baseline characteristic relating to an inrush peak of the PTCR heater assembly and based on the input voltage and the current; and determining an observed characteristic relating to the inrush peak of the PTCR heater assembly and based on the input voltage and the current. The method further includes comparing the observed characteristic to the baseline characteristic; assessing a health status of the PTCR heater assembly based on the observed characteristic and the baseline characteristic; and outputting the health status for PTCR heater assembly diagnostics and/or prognostics.

BRIEF DESCRIPTION OF THE DRAWINGS

FIG. 1 is a schematic illustration of an aircraft with air data probes.

DETAILED DESCRIPTION

In general, the present disclosure describes a system and method for assessing the overall health of an air data probe heater that includes one or more PTCR heating elements (i.e., a PTCR heater assembly) by determining characteristics of the startup current profile or the startup power profile, such as inrush peak current or startup power. Based on a comparison between baseline and observed characteristics (e.g., magnitude, time, slope, or area under the curve) relating to the inrush current or startup power for the PTCR heater assembly, it is possible to make an improved diagnostic or prognostic determination of PTCR heater assembly health. The system and method for assessing PTCR heater health disclosed herein are described below with reference to FIGS. 1-5.

FIG. 1 is a schematic illustration of aircraft 10 including air data probes 12A-12N ("N" is used herein as an arbitrary integer). While illustrated as a commercial aircraft, other vehicles may also include air data probes 12A-12N configured to sense characteristics of the environment. Air data probes 12A-12N are aircraft components. Air data probes 12A-12N may be any type of probe, including, but not limited to, pitot probes, pitot-static probes, static ports, total air temperature (TAT) probes, angle-of-attack (AOA) probes, and any other probes or aircraft equipment that may include PTCR heaters. In operation, air data probes 12A-12N sense air data parameters such as air pressure, temperature, and airflow direction. Air data probes 12A-12N may be exposed to harsh conditions during aircraft flight or on the ground, and ice may build up on portions of air data probes 12A-12N and interfere with sensing accuracy. Heaters (not shown) can be implemented with air data probes 12A-12N to prevent or reduce ice formation on and around air data probes 12A-12N. Therefore, it is beneficial to assess the health of a probe heater to better detect or predict maintenance needs of the air data probe itself and prevent incidents caused by inaccurate sensing from compromised air data probes.

Figure 2A:
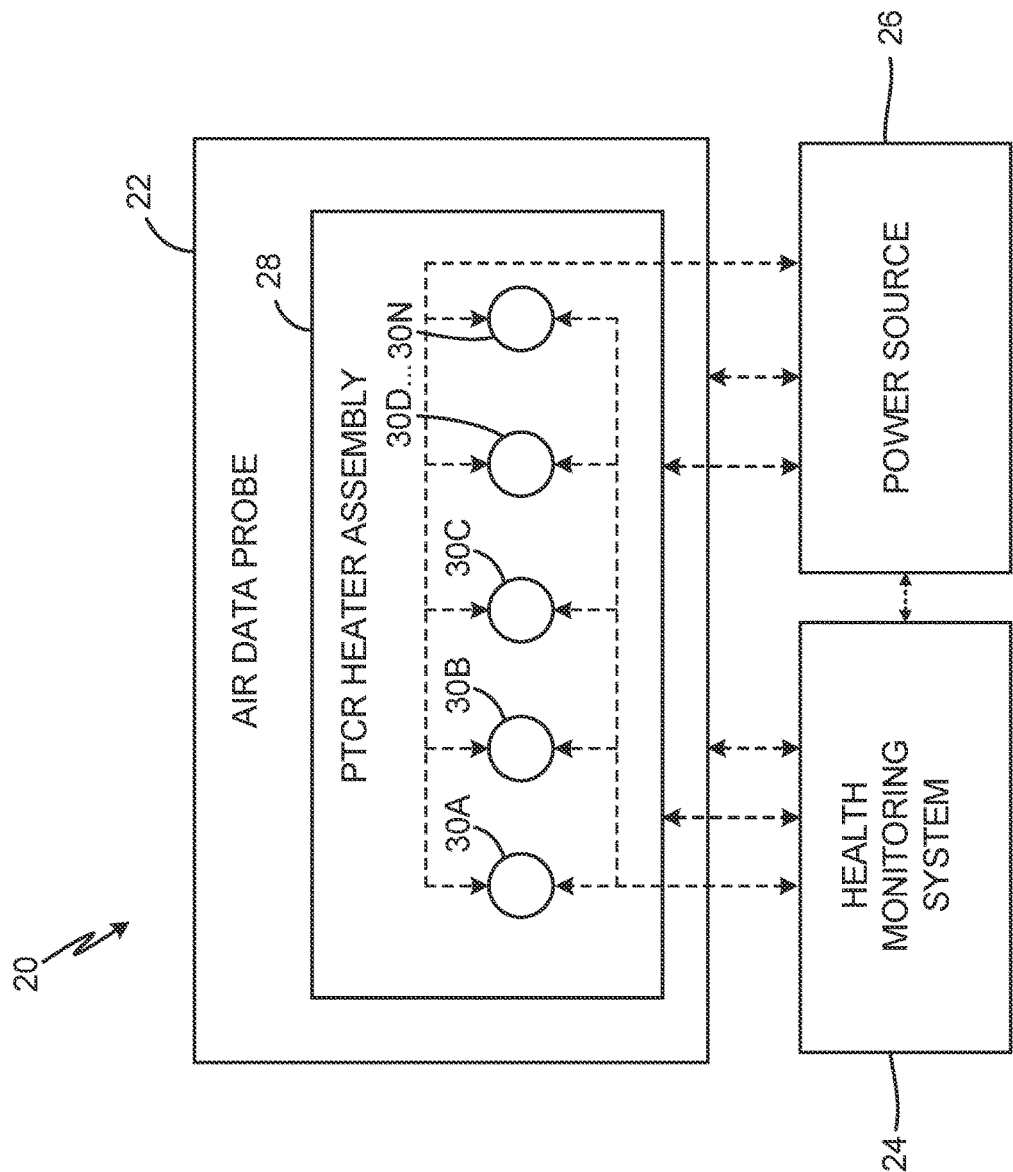
FIG. 2A is a schematic illustration of an air data probe system for assessing health of a PTCR heater assembly of an air data probe.
Figure 2B:
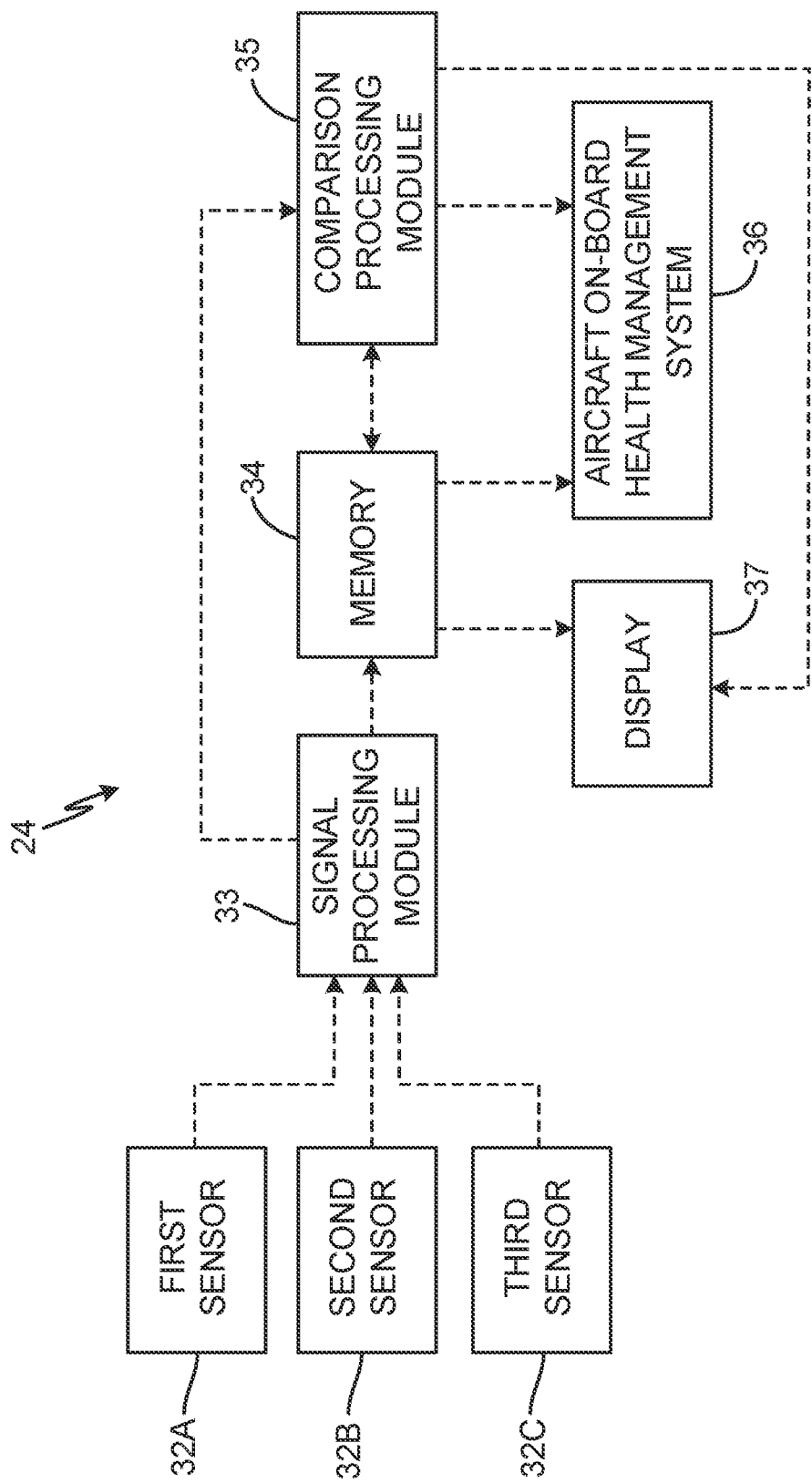
FIG. 2B is a schematic illustration showing a health monitoring system of the air data probe system.
Figure 3:
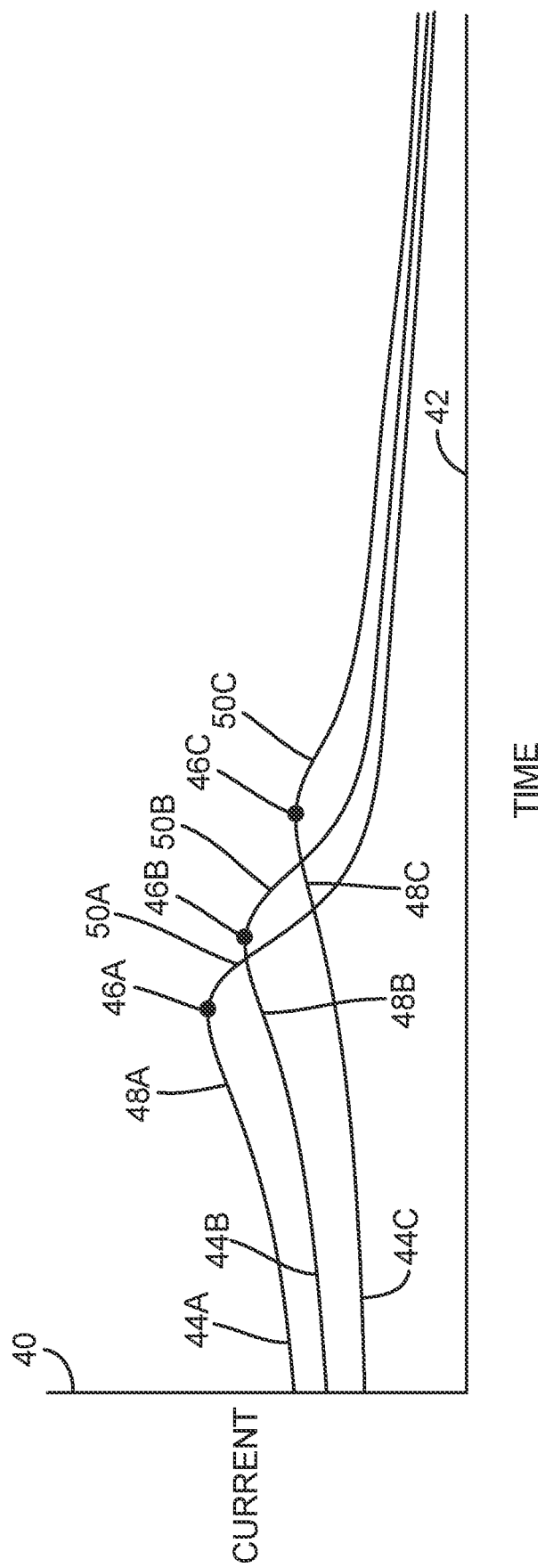
FIG. 3 is a chart illustrating functions of current of the PTCR heater assembly over time.
Figure 4:
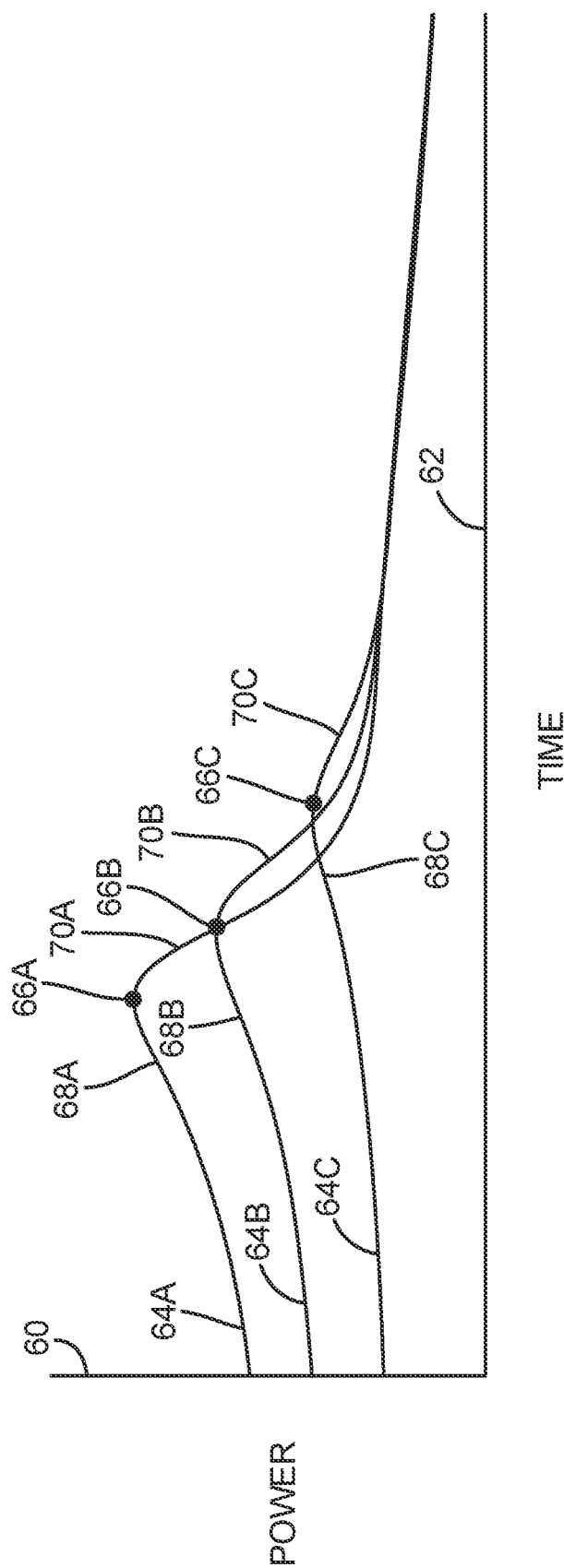
FIG. 4 is a chart illustrating functions of power of the PTCR heater assembly over time.
Figure 5:
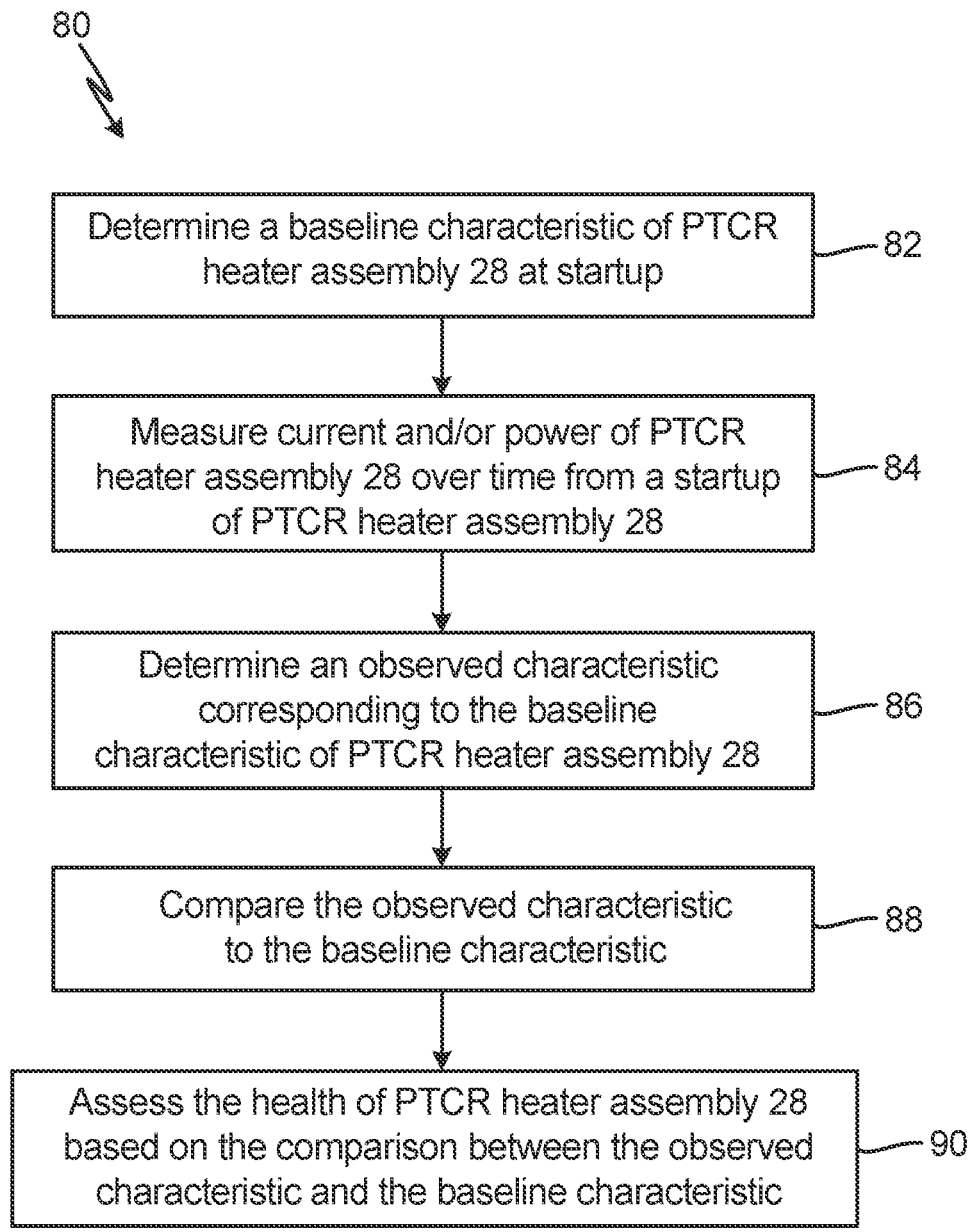
FIG. 5 is a process flow diagram showing steps for assessing health of the PTCR heater assembly.

FIGS. 2A-5 will be discussed together. FIG. 2A is a schematic illustration of air data probe system 20. FIG. 2B is a schematic illustration showing health monitoring system 24 of air data probe system 20. FIG. 3 is a chart illustrating functions of current of PTC heater assembly 28 over time. FIG. 4 is a chart illustrating functions of power of PTC heater assembly 28 over time. FIG. 5 is a process flow diagram showing steps 82-90 for assessing heath of PTC heater assembly 28.

As shown in FIGS. 2A-2B, air data probe system 20 includes air data probe 22 (e.g., one of air data probes 12A-12N shown in FIG. 1), health monitoring system 24, and power source 26. Air data probe 22 includes PTC heater assembly 28, which further includes one or more PTC heating elements 30A-30N. Health monitoring system 24 can include first sensor 32A, second sensor 32B, third sensor 32C, signal processing module 33, memory 34, comparison processing module 35, aircraft on-board health management system 36, and display 37.

Air data probe 22 is an aircraft component. Air data probe 22 may be any type of probe, including, but not limited to, pitot probes, pitot-static probes, total air temperature (TAT) probes, angle-of-attack (AOA) probes, and any other probes that may include PTC heaters. Though illustrated in FIG. 2A as a single air data probe 22, air data probe system 20 can include any number of air data probes 22. Air data probe 22 is configured to be installed on an aircraft such that air data probe 22 protrudes from the aircraft fuselage (not shown) into the external airflow.

Air data probe 22 can be electrically connected to health monitoring system 24 in air data probe system 20. Health monitoring system 24 can be analog (e.g., for bench tests when air data probe 22 is removed from an aircraft) or digital (e.g., for air data probe 22 installed on an aircraft). Health monitoring system 24 can also include a wired or wireless connection to components of air data probe system 20. Though the example of FIG. 2 illustrates health monitoring system 24 as operatively coupled (e.g., remote) to air data probe 22, it should be understood that in other examples, health monitoring system 24 or part of health monitoring system 24 can be integrated locally with air data probe 22 to communicate with the components of air data probe system 20. In yet other examples, health monitoring system 24 can include one or more sensing devices, instruments, circuitries, processors, controller devices, or other components that can be coupled to or integrated with air data probe 22 to communicate with the components of air data probe system 20. For example, any processor components of health monitoring system 24 (as shown in FIG. 2B) can be one processor or, alternatively, can each have dedicated processors. Health monitoring system 24 may include, for example, a microcontroller, programmable logic device, application-specific integrated circuit (ASIC), or any other digital and/or analog circuitry. In other examples, health monitoring system 24 can include a spreadsheet that performs mathematical operations.

Air data probe 22 is electrically connected to power source 26 in air data probe system 20. Power source 26 may be any direct current (DC) or alternating current (AC) power source. Power source 26 can be implemented separately from or integrated with health monitoring system 24. Power source 26 provides power (e.g., an input voltage) to air data probe 22 and any components of air data probe 22. Power source 26 may also provide power to components of health monitoring system 24.

As shown in FIG. 2A, air data probe 22 has PTCR heater assembly 28 to heat air data probe 22 and any associated components of air data probe 22. PTCR heater assembly 28 is thermally coupled to air data probe 22. PTCR heater assembly 28 may be connected to or contained within any components of air data probe 22. As shown in FIG. 2A, PTCR heater assembly 28 includes one or more PTCR heating elements 30A-30N (e.g., an array, if multiple PTCR heating elements) thermally coupled to air data probe 22 or components of air data probe 22. Each PTCR heating element 30A-30N is a positive temperature coefficient resistor (PTCR). Individual PTCR heating elements 30A-30N may be connected in parallel. Though PTCR heater assembly 28 is shown in FIG. 2A to include five PTCR heating elements 30A-30N, it should be understood that PTCR heater assembly 28 can include more or fewer individual PTCR heating elements 30A-30N. In one non-limiting example, PTCR heater assembly 28 can include seventeen PTCR heating elements. In another non-limiting example, PTCR heater assembly 28 can include twelve PTCR heating elements. In another non-limiting example, PTCR heater assembly 28 can include one of PTCR heating elements 30A-30N. In yet other examples, PTCR heater assembly 28 can include any suitable number of PTCR heating elements 30A-30N.

In some embodiments, PTCR heater assembly 28 can be a low-power assembly, a nominal assembly, or a high-power assembly, depending on the production characteristics of PTCR heating elements 30A-30N. Low-power, nominal, or high-power assemblies can have different inherent resistances. For example, a low-power assembly could draw a lower power than a nominal assembly regardless of the input voltage applied, and a high-power assembly could draw a higher power than a nominal assembly regardless of the input voltage applied.

Air data probe 22, PTCR heater assembly 28, and individual PTCR heating elements 30A-30N can be electrically connected to power source 26 within air data probe system 20 to receive power. Air data probe 22, PTCR heater assembly 28, and individual PTCR heating elements 30A-30N can also be connected to health monitoring system 24 or components of health monitoring system 24. As such, health monitoring system 24 can be configured to communicate with any one or more of the components of air data probe system 20, including air data probe 22, PTCR heater assembly 28, and individual PTCR heating elements 30A-30N. Health monitoring system 24 can be configured to implement process instructions for operational control of air data probe 22 and components of air data probe 22, such as PTCR heater assembly 28. Health monitoring system 24 is also configured to receive and communicate sensed data from air data probe 22, PTCR heater assembly 28, and individual PTCR heating elements 30A-30N.

As shown in FIG. 2B, health monitoring system 24 includes first sensor 32A, second sensor 32B, and third sensor 32C. In alternate embodiments, health monitoring system 24 does not include third sensor 32C. In further alternate embodiments, health monitoring system 24 can include any suitable number of sensors 32A-32C. Further, any of first sensor 32A, second sensor 32B, and third sensor 32C can be separate sensors (i.e., separate instruments or devices) or can be integrated as part of the same sensor or sensing instrument or device. For example, first sensor 32A, second sensor 32B, and third sensor 32C can be external measurement devices utilized in an embodiment where air data probe 22 is not installed on an aircraft and requires external measurement devices for signal measurement. In alternate embodiments, first sensor 32A, second sensor 32B, and third sensor 32C may be any suitable sensors.

For example, first sensor 32A can be a voltage sensor. First sensor 32A can sense a voltage of PTCR heater assembly 28 and produce a first signal representing the sensed voltage. The sensed voltage may be an input voltage. Second sensor 32B can be a current sensor. In some embodiments, second sensor 32B can be a current sensor such as a hall effect, current transformer, or other suitable sensor requiring signal processing before it is input to a processor. Second sensor 32B can sense a current of PTCR heater assembly 28 and produce a second signal representing the sensed current. The sensed current varies as a function of time, as will be described in greater detail below with respect to FIGS. 3 and 4. Third sensor 32C can be a temperature sensor. Third sensor 32C can sense a temperature of PTCR heater assembly 28 and produce a third signal representing the sensed temperature. The sensed temperature may be an ambient or starting temperature of PTCR heater assembly 28 (e.g., room temperature). In some embodiments, starting temperature can be set by soaking PTCR heater assembly 28 in a temperature chamber prior to applying power or by soaking PTCR heater assembly 28 at room temperature while PTCR heater assembly 28 is "off" for some period of time. In other embodiments (e.g., those that only consider the magnitude of the inrush peak), known or sensed temperature may not be needed.

Signal processing module 33 can be electrically connected to sensors 32A-32C. The first signal representing the sensed voltage, the second signal representing the sensed current, and the third signal representing the sensed temperature can be provided to signal processing module 33 for processing (i.e., conditioning). For example, in embodiments where second sensor 32B is a hall effect current sensor, signal processing module 33 can process (i.e., condition) the hall effect output signal.

Signal processing module 33 can produce an output signal based on one or more of the sensed voltage, the sensed current, and the sensed temperature. The output signal is representative of current and/or power of PTCR heater assembly 28 as a function of time. The output signal can depend on having a known input voltage and, in some embodiments, a known starting temperature of PTCR heater assembly 28. For example, a power of PTCR heater assembly 28 can be calculated based on the sensed input voltage and the sensed current. The output signal may also be amplified and digitized at signal processing module 33. Further, the output signal may represent a baseline or observed output signal, depending on when the output signal is produced. A baseline output signal is produced from signals or data received from sensors 32A-32C immediately or shortly after PTCR heater assembly 28 is assembled. An observed output signal is produced from signals or data received from sensors 32A-32C during the lifetime of PTCR heater assembly 28.

Signal processing module 33 outputs the output signal representing current and/or power of PTCR heater assembly 28 to memory 34 and/or comparison processing module 35. In some embodiments, signal processing module 33, memory 34, and comparison processing module 35 can be parts of the same processor (of health monitoring system 34). In other embodiments, signal processing module 33, memory 34, and comparison processing module 35 can be dedicated devices.

Memory 34 (i.e., computer-readable memory) of health monitoring system 24 receives and can be configured to store the output signal from signal processing module 33 as a stored signal. For example, memory 34 can be a microcontroller onboard flash memory for storing truth tables or calibration data. In other embodiments, memory 34 can be external memory.

Specifically, the baseline output signal from signal processing module 33 can be stored at memory 34 in a truth table (i.e., the truth table can be pre-programmed). Memory 34 can also store the observed output signal from signal processing module 33 (e.g., to be compared by comparison processing module 35 to the pre-programmed truth table). The stored signals from memory 34 can be accessed by any one or more of comparison processing module 35, aircraft on-board health management system 36, and display 37. The computer-readable memory can be described, in some examples, as computer-readable storage media. In some examples, a computer-readable storage medium can include a non-transitory medium. The term "non-transitory" can indicate that the storage medium is not embodied in a carrier wave or a propagated signal. In certain examples, a non-transitory storage medium can store data that can, over time, change (e.g., in RAM or cache). Computer-readable memory of control circuitry 16 can include volatile and non-volatile memories. Examples of volatile memories can include random access memories (RAM), dynamic random access memories (DRAM), static random access memories (SRAM), and other forms of volatile memories. Examples of non-volatile memories can include magnetic hard discs, optical discs, floppy discs, flash memories, or forms of electrically programmable memories (EPROM) or electrically erasable and programmable (EEPROM) memories.

Comparison processing module 35 can be electrically connected to signal processing module 33 to receive the output signals and to memory 34 to receive the stored signals. As described above, in some embodiments, signal processing module 33 and comparison processing module 35 can be implemented on the same processor. In other embodiments, signal processing module 33 and comparison processing module 35 can be implemented in dedicated processors.

Comparison processing module 35 compares the observed output signal to the baseline output signal to determine if there is a difference. This comparison may or may not be performed in real time, as measurements are taking place. In a real-time embodiment, comparison processing module 35 would compare the observed output signal from signal processing module 33 to a stored baseline output signal from memory 34. In a non-real-time embodiment, comparison processing module 35 would compare a stored observed output signal and a stored baseline output signal from memory 34.

Specifically, comparison processing module 35 can determine baseline characteristics from the baseline output signal and observed characteristics from the observed output signal (as will be described in greater detail below with respect to FIGS. 3 and 4) and compare the observed characteristics to the baseline characteristics. Comparison processing module 35 produces a comparison signal that is representative of a health status of PTCR heater assembly 28 (i.e., that is representative of any difference between the observed output signal/the observed characteristics and the baseline output signal/the baseline characteristics). In some examples, the difference may be represented as a calculated percent deviation from the baseline output signal. The comparison signal comprising the health status is output from comparison processing module 35 for PTCR heater assembly diagnostics and/or prognostics.

Aircraft on-board health management system 36 and/or display 37 can be electrically connected to memory 34 and comparison processing module 35 to receive the stored signal and the comparison signal. In embodiments where air data probe 22 with PTCR heater assembly 28 is installed on an aircraft, the stored signal and/or the comparison signal can be communicated to aircraft on-board health management system 36 so that a health status of PTCR heater assembly 28 can be determined. In some embodiments, aircraft on-board health management system 36 can include integrated display 37. In other embodiments (e.g., where air data probe 22 is not installed on an aircraft), the stored signal and/or the comparison signal are not communicated to an aircraft on-board health management system but rather can be communicated directly to display 37. Display 37 can be any suitable display interface where a health status notification and/or a visual representation of the stored signal and the comparison signal can be displayed. In some examples, a health status notification can be output if the observed characteristic exceeds a threshold percent deviation from the baseline characteristic.

In operation, an input voltage (i.e., an applied voltage) is provided from power source 26 to each individual PTCR heating element 30A-30N of PTCR heater assembly 28 to provide heating for air data probe 22. PTCR heating elements 30A-30N can also receive input voltage from a different power source in a bench test environment before being installed on an aircraft. The input voltage provided by power source 26 may vary between different builds of PTCR heater assembly 28. In some examples, a nominal input voltage is applied to PTCR heater assembly 28. This way, characteristics of an inrush peak in current or power can be normalized for small variations in the input voltage as measured by a voltage sensor (e.g., first sensor 32A).

As described above with respect to FIG. 2B, analog or digitally implemented health monitoring system 24 can sense and communicate characteristics of PTCR heater assembly 28 in operational and/or testing environments. Characteristics such as current or power of PTCR heater assembly 28 can be measured over time, beginning at startup of PTCR heater assembly 28. For example, a startup period can represent approximately the first zero to five seconds after PTCR heater assembly 28 is powered "on" after a long "off" period or in a bench test (i.e., zero to five seconds after an input voltage is provided to PTCR heating elements 30A-30N of PTCR heater assembly 28). A long "off" period allows a temperature of PTCR heater assembly 28 to stabilize at ambient temperature.

For example, FIG. 3 illustrates current 40 (displayed on y-axis) measured over time 42 (displayed on x-axis). Functions 44A, 44B, and 44C correspond to the startup current draw for a PTCR heater assembly (e.g., PTCR heater assembly 28). Thus, functions 44A, 44B, and 44C can be examples of graphical representations of the output signal produced by signal processing module 33. The graph (i.e., waveform) of each of functions 44A, 44B, and 44C includes essentially the same features, which are labeled respectively with A, B, or C but which may be referred to generally herein by the shared reference number. For example, maximum 46 refers collectively to maxima 46A, 46B, and 46C.

As shown in FIG. 3, functions 44A, 44B, and 44C can be derived from PTCR heater assemblies at three different input voltages. Function 44A can be derived from first PTCR heater assembly 28A configured to accept a first input voltage. Function 44B can be derived from second PTCR heater assembly 28B configured to accept a second input voltage. Function 44C can be derived from third PTCR heater assembly 28C configured to accept a third input voltage. The first, second, and third input voltages can be any suitable input voltage for a PTCR heater assembly. In alternative embodiments, functions 44A, 44B, and 44C can be derived from PTCR heater assemblies with three different inherent resistances (e.g., a high-power assembly, a nominal assembly, and a low-power assembly). As such, PTCR heater assembly 28A from which function 44A is derived can be a high-power assembly, PTCR heater assembly 28B from which function 44B is derived can be a nominal assembly, and PTCR heater assembly 28C from which function 44C is derived can be a low-power assembly. In some embodiments, PTCR heater assembly 28 shown in FIG. 2A can be any one or more of PTCR heater assemblies 28A, 28B, and 28C.

Current 40 of PTCR heater assemblies 28A-28C at startup reaches maximum 46 corresponding to an inrush current peak and a minimum resistance of PTCR heater assemblies 28A-28C (and individual PTCR heating elements 30A-30N). Subsequently, the resistance increases rapidly and current decreases. Thus, the graph of each of functions 44A, 44B, and 44C has first portion 48 increasing up to maximum 46 and second portion 50 decreasing away from maximum 46. First portion 48 and second portion 50 have respective slopes (i.e., change in current over change in time). The magnitude of maximum 46, the time corresponding to maximum 46 (i.e., the time at peak current draw), the slope of first portion 48, the slope of second portion 50, and the area under the curve for first portion 48 and second portion 50 relate to the inrush current peak and can vary based on the input voltage and starting temperature of the respective PTCR heater assembly 28A-28C.

A measurement of any of these characteristics (magnitude of maximum 46, time corresponding to maximum 46, slope and/or area under the curve of first portion 48, and slope and/or area under the curve of second portion 50) taken immediately after production of PTCR heater assemblies 28A-28C can serve as a stored baseline (i.e., the baseline characteristic) for comparison to measurements taken over the lifetime of respective PTCR heater assembly 28A-28C. For example, baseline characteristics can be determined at comparison processing module 35 from the baseline output signal produced by signal processing module 33. Any of these characteristics can also be observed measurements (i.e., the observed characteristic) taken over the lifetime of respective PTCR heater assembly 28A-28C. For example, observed characteristics can be determined at comparison processing module 35 from the observed output signal produced by signal processing module 33.

FIG. 4 illustrates power 60 (displayed on y-axis) measured over time 62 (displayed on x-axis). Functions 64A, 64B, and 64C correspond to the startup power draw for a PTCR heater assembly (e.g., PTCR heater assembly 28). Thus, functions 64A, 64B, and 64C can be examples of graphical representations of the output signal produced by signal processing module 33. The graph (i.e., waveform) of each of functions 64A, 64B, and 64C includes essentially the same features, which are labeled respectively with A, B, or C but which may be referred to generally herein by the shared reference number. For example, maximum 66 refers collectively to maxima 66A, 66B, and 66C.

Like functions 44A, 44B, and 44C shown in FIG. 3, functions 64A, 64B, and 64C shown in FIG. 4 can be derived from PTCR heater assemblies at three different input voltages. Function 64A can be derived from first PTCR heater assembly 28A configured to accept the first input voltage. Function 64B can be derived from second PTCR heater assembly 28B configured to accept the second input voltage. Function 64C can be derived from third PTCR heater assembly 28C configured to accept the third input voltage. The first, second, and third input voltages can be any suitable input voltage for a PTCR heater assembly. In alternative embodiments, functions 64A, 64B, and 64C can be derived from PTCR heater assemblies with three different inherent resistances (e.g., a high-power assembly, a nominal assembly, and a low-power assembly). As such, PTCR heater assembly 28A from which function 64A is derived can be a high-power assembly, PTCR heater assembly 28B from which function 64B is derived can be a nominal assembly, and PTCR heater assembly 28C from which function 64C is derived can be a low-power assembly. In some embodiments, PTCR heater assembly 28 shown in FIG. 2A can be any one or more of PTCR heater assemblies 28A, 28B, and 28C.

Maximum 66 corresponds to the inrush power peak and the minimum resistance of PTCR heater assemblies 28A-28C. Thus, like functions 44A, 44B, and 44C in FIG. 3, the graph of each of functions 64A, 64B, and 64C has first portion 68 increasing up to maximum 66 and second portion 70 decreasing away from maximum 66. First portion 68 and second portion 70 have respective slopes (i.e., change in power over change in time). The magnitude of maximum 66, the time corresponding to maximum 66 (i.e., the time at peak power draw), the slope of first portion 68, the slope of second portion 70, and the area under the curve for first portion 68, and second portion 70 relate to the inrush power peak and can vary based on the input voltage and starting temperature of the respective PTCR heater assembly 28A-28C.

A measurement of any of these characteristics (magnitude of maximum 66, time corresponding to maximum 66, slope and/or area under the curve of first portion 68, and slope and/or area under the curve of second portion 70) taken immediately after production of PTCR heater assemblies 28A-28C can serve as a stored baseline (i.e., the baseline characteristic) for comparison to measurements taken over the lifetime of respective PTCR heater assembly 28A-28C. For example, baseline characteristics can be determined at comparison processing module 35 from the baseline output signal produced by signal processing module 33. Any of these characteristics can also be observed measurements (i.e., the observed characteristic) taken over the lifetime of respective PTCR heater assembly 28A-28C. For example, observed characteristics can be determined at comparison processing module 35 from the observed output signal produced by signal processing module 33.

Functions 44A-44C and functions 64A-64C may be obtained through baseline testing immediately after production of PTCR heater assemblies 28A-28C. In baseline testing, the graphs of functions 44A-44C and/or functions 64A-64C can be stored as baseline waveforms (i.e., the baseline output signal) having baseline characteristics as described above. For example, the waveforms of functions 44A-44C and functions 64A-64C shown in FIGS. 3 and 4, respectively, can represent baseline waveforms. Functions 44A-44C and functions 64A-64C may also be obtained through diagnostic bench testing when air data probe 22 with PTCR heater assembly 28 is removed from an aircraft, or through aircraft diagnostics or prognostics when air data probe 22 with PTCR heater assembly 28 is installed on an aircraft or vehicle. In diagnostic or prognostic testing, the observed waveforms of functions 44A-44C and/or functions 64A-64C (i.e., the observed output signal) having observed characteristics as described above can be compared to stored baseline waveforms for the respective PTCR heater assembly 28A-28C. For example, when PTCR heater assemblies 28A-28C are fully functional (i.e., not degraded) the observed waveforms of functions 44A-44C and functions 64A-64C obtained through diagnostic or prognostic testing will be the same or very similar to the baseline waveforms of functions 44A-44C and functions 64A-64C shown in FIGS. 3 and 4. If PTCR heater assemblies are degraded, the observed waveforms of functions 44A-44C and functions 64A-64C obtained through diagnostic or prognostic testing will be shifted or different from the baseline waveforms of functions 44A-44C and functions 64A-64C shown in FIGS. 3 and 4. Thus, diagnostic or prognostic testing of PTCR heater assembly 28 can be utilized to assess the overall health of PTCR heater assembly 28 and air data probe 22.

As seen in FIG. 5, process 80 includes steps 82-90 for assessing the overall health of PTCR heater assembly 28. For example, air data probe system 20 can execute health assessment process 80 via health monitoring system 24. Process 80 analyzes sensed data from PTCR heater assembly 28 and other data to enable diagnostic or prognostic determinations of overall health of PTCR heater assembly 28 and air data probe 22.

At step 82 of process 80, a baseline characteristic of PTCR heater assembly 28 at startup is determined. The baseline characteristic is any one or more of the characteristics relating or corresponding to the inrush peak in current or power as described above with respect to FIGS. 3 and 4. For example, as shown in FIG. 3, the baseline characteristic can be any one or more of the magnitude of maximum 46, the time corresponding to maximum 46, the slope and/or area under the curve of first portion 48, and the slope and/or area under the curve of second portion 50. In other examples, as shown in FIG. 4, the baseline characteristic can be any one or more of the magnitude of maximum 66, the time corresponding to maximum 66, the slope and/or area under the curve of first portion 68, and the slope and/or area under the curve of second portion 70.

The baseline characteristic is determined during the startup period after an input voltage is supplied to PTCR heating elements 30A-30N. In an exemplary embodiment, the baseline characteristic is determined immediately or shortly after production of PTCR heater assembly 28. Further, the baseline characteristic can be determined at comparison processing module 35 from the baseline output signal produced by signal processing module 33 and/or stored at memory 34. The baseline characteristic will be particular to PTCR heater assembly 28 (e.g., a low-power, nominal, or high-power assembly) from which it is measured. After the baseline characteristic is determined, air data probe 22 including PTCR heater assembly 28 may be installed on an aircraft or other vehicle.

At step 84, the current and/or power of PTCR heater assembly 28 over time from startup of PTCR heater assembly 28 is measured. Current 40 over time 42 and/or power 60 over time 62 can be measured (e.g., directly or indirectly by sensors 32A-32C) when PTCR heating elements 30A-30N are connected to power source 26 (i.e., powered "on").

At step 86, an observed characteristic is determined for PTCR heater assembly 28. The observed characteristic is any one or more of the characteristics described above with respect to FIGS. 3 and 4. For example, as shown in FIG. 3, the observed characteristic can be any one or more of the magnitude of maximum 46, the time corresponding to maximum 46, the slope and/or area under the curve of first portion 48, and the slope and/or area under the curve of second portion 50. In other examples, as shown in FIG. 4, the observed characteristic can be any one or more of the magnitude of maximum 66, the time corresponding to maximum 66, the slope and/or area under the curve of first portion 68, and the slope and/or area under the curve of second portion 70.

The observed characteristic corresponds to the baseline characteristic (i.e., is the same one of magnitude of the maximum, time corresponding to the maximum, slope of the first or second portion, or area under the curve of the first or second portion), such that the observed characteristic and the baseline characteristic can be directly compared. The observed characteristic is measured during the startup period after an input voltage is supplied to PTCR heating elements 30A-30N. In an exemplary embodiment, step 86 occurs after PTCR heater assembly 28 has experienced a long "off" period or during a bench test when air data probe 22 is removed from the aircraft or vehicle. Further, the observed characteristic can be determined at comparison processing module 35 from the observed output signal produced by signal processing module 33 and/or stored at memory 34.

At step 88, the observed characteristic is compared to the baseline characteristic. This comparison can involve referring to the baseline characteristics/the baseline output signal stored in memory 34 of health monitoring system 24. In an exemplary embodiment, step 88 is implemented by comparison processing module 35. Over the lifetime of PTCR heater assembly 28, there may be a change in the observed characteristic with respect to the baseline characteristic. A difference between the observed characteristic and the baseline characteristic may be represented by a percent deviation from the baseline characteristic.

At step 90, the health of PTCR heater assembly 28 is assessed based on the comparison between the observed characteristic and the baseline characteristic in step 88. For example, a threshold percent deviation (e.g., 5%, 10%, 15%, or the like) of the observed characteristic from the baseline characteristic may indicate a level of degradation or reduced functionality of PTCR heater assembly 28 if the observed characteristic exceeds the threshold. In other examples, there may be multiple predetermined threshold percent deviations corresponding to different levels of degradation or reduced functionality. A predetermined threshold may correspond to the failure of one or more individual PTCR heating elements 30A-30N.

Process 80 is diagnostic when implemented in a bench test and diagnostic or prognostic when implemented while air data probe 22 is installed on an aircraft or vehicle. In some embodiments (e.g., prognostic embodiments), health monitoring system 24 can output a notification or warning for preventative maintenance when the observed characteristic of PTCR heater assembly 28 exceeds a particular threshold percent deviation or indicate a failure if the deviation is excessive. In an exemplary embodiment, the notification or indication is output to display 37. Health data from the assessment of PTCR heater assembly 28 can also be communicated via health monitoring system 24 to other aircraft systems, such as aircraft on-board health management system 36. In other embodiments (e.g., diagnostic embodiments), health monitoring system 24 can provide suggestions for preventative replacement of PTCR heater assembly 28 if there is a relatively small deviation or mandate replacement if there is considerable deviation and air data probe 22 with PTCR heater assembly 28 will no longer operate as intended. In an exemplary embodiment, suggestions or mandates relating to replacement are displayed on display 37.

PTCR heaters function differently from traditional resistive heaters in that PTCR heaters comprised of one or more individual PTCR heating elements connected in parallel are self-regulating and self-compensating due to the inherent characteristics of positive temperature coefficient resistors. In other words, having an array of multiple PTCR heating elements within a PTCR heater assembly provides redundancy, but because of this self-regulation and self-compensation, it can be very difficult to detect if individual PTCR heating elements within a PTCR heater assembly are degraded or damaged. Specifically, if one PTCR heating element within the array fails, it will create a higher thermal load on any adjacent PTCR heating elements, the adjacent PTCR heating elements will produce more heat to compensate, and there will be a minimal or imperceptible change in the overall PTCR heater assembly current. Thus, it can be difficult to detect individual failures when measuring current from the whole array. Due to lack of prognostics, air data probe heaters are typically replaced once a fault occurs or an aircraft incident is found.

The system and method described herein enable monitoring of the health of PTCR heater assembly 28. Characteristics such as magnitude, time, slope, and area under the curve relating to the inrush peak in current or power can be easily compared over the lifetime of PTCR heater assembly 28 and can provide multiple ways for monitoring the health of PTCR heater assembly 28 having one or more PTCR heating elements 30A-30N. For example, comparing the time, slope, or area under the curve can be a more precise alternative to directly observing the magnitude of the peak inrush current/power, particularly in embodiments with multiple PTCR heating elements 30A-30N. Current and power of PTCR heater assembly 28 as functions of time are alternative means for an operator to determine and assess health status information about PTC heater assembly 28. Moreover, comparing the slope can be less dependent on the starting temperature because the crucial value is not the time to the inrush peak but rather the rate of change before and after the peak.

PTCR heater assemblies 28 are typically serialized in production, so baseline characteristics can be determined immediately after each PTCR heater assembly 28 is assembled. Because baseline characteristics are determined for a particular PTCR heater assembly 28 and compared to observed characteristics of the same assembly, it is possible to detect degradation or decreased functionality of PTC heater assembly 28. This detection can include detecting if a single PTCR heating element 30A-30N within PTCR heater assembly 28 has failed.

The system and method described herein can be implemented diagnostically for bench tests or diagnostically or prognostically when air data probe 22 with PTCR heater assembly 28 is installed on an aircraft or vehicle. This allows air data probe 22 implemented with PTCR heater assembly 28 and health monitoring system 24 to self-diagnose heater degradation and proactively inform an operator if PTCR heater assembly 28 or any individual PTCR heating elements 30A-30N need to be replaced prior to a major failure.

Discussion of Possible Embodiments

The following are non-exclusive descriptions of possible embodiments of the present invention.

A system for determining a health status of a positive temperature coefficient resistor (PTCR) heater assembly includes a PTCR heater assembly and a health monitoring system. An input voltage is provided to the PTCR heater assembly to provide heating. The health monitoring system includes a first sensor configured to sense the input voltage at the PTCR heater assembly and a second sensor configured to sense a current through the PTCR heater assembly. The health monitoring system is configured to determine a baseline characteristic and an observed characteristic each relating to an inrush peak of the PTCR heater assembly and based on the input voltage and the current. The health monitoring system compares the observed characteristic to the baseline characteristic to assess a health status of the PTCR heater assembly and outputs the health status for PTCR heater assembly diagnostics and/or prognostics.

The system of the preceding paragraph can optionally include, additionally and/or alternatively, any one or more of the following features, configurations and/or additional components:

The baseline characteristic can be a baseline time and the observed characteristic can be an observed time.

The baseline characteristic can be a baseline change in current over change in time comprising a first baseline slope before the inrush peak and a second baseline slope after the inrush peak, and the observed characteristic can be an observed change in current over change in time comprising a first observed slope before the inrush peak and a second observed slope after the inrush peak.

The baseline characteristic can be a baseline change in power over change in time comprising a first baseline slope before the inrush peak and a second baseline slope after the inrush peak, and the observed characteristic can be an observed change in power over change in time comprising a first observed slope before the inrush peak and a second observed slope after the inrush peak.

The baseline characteristic can be a baseline magnitude of the inrush peak and the observed characteristic can be an observed magnitude of the inrush peak.

The baseline characteristic can be a baseline area under the curve and the observed characteristic can be an observed area under the curve.

The PTCR heater assembly can include an array of PTCR heating elements.

The health monitoring system can include a third sensor configured to sense a starting temperature of the PTCR heater assembly.

A system for an aircraft includes an air data probe that includes a positive temperature coefficient resistor (PTCR) heater assembly and a health monitoring system. An input voltage is provided to the PTCR heater assembly to provide heating for the air data probe. The health monitoring system includes a first sensor configured to sense the input voltage at the PTCR heater assembly and a second sensor configured to sense a current through the PTCR heater assembly. The health monitoring system is configured to determine a baseline characteristic and an observed characteristic each relating to an inrush peak of the PTCR heater assembly and based on the input voltage and the current. The health monitoring system compares the observed characteristic to the baseline characteristic to assess a health status of the PTCR heater assembly and outputs the health status for PTCR heater assembly diagnostics and/or prognostics.

The system of the preceding paragraph can optionally include, additionally and/or alternatively, any one or more of the following features, configurations and/or additional components:

The baseline characteristic can be a baseline time and the observed characteristic can be an observed time.

The baseline characteristic can be a baseline magnitude of the inrush peak and the observed characteristic can be an observed magnitude of the inrush peak.

The baseline characteristic can be a baseline change in current over change in time and the observed characteristic can be an observed change in current over change in time.

The baseline characteristic can be a baseline change in power over change in time and the observed characteristic can be an observed change in power over change in time.

A method for determining a health status of a positive temperature coefficient resistor (PTCR) heater assembly includes providing an input voltage to the PTCR heater assembly. The method further includes sensing the input voltage at and a current through the PTCR heater assembly; determining a baseline characteristic relating to an inrush peak of the PTCR heater assembly and based on the input voltage and the current; and determining an observed characteristic relating to the inrush peak of the PTCR heater assembly and based on the input voltage and the current. The method further includes comparing the observed characteristic to the baseline characteristic; assessing a health status of the PTCR heater assembly based on the observed characteristic and the baseline characteristic; and outputting the health status for PTCR heater assembly diagnostics and/or prognostics.

The method of the preceding paragraph can optionally include, additionally and/or alternatively, any one or more of the following features, configurations, operations, and/or additional components:

The baseline characteristic can be a baseline time and the observed characteristic can be an observed time.

The baseline characteristic can be a baseline change in current over change in time and the observed characteristic can be an observed change in current over change in time.

The baseline characteristic can be a baseline change in power over change in time and the observed characteristic can be an observed change in power over change in time.

Determining the baseline characteristic can include determining the baseline characteristic during a startup period of the PTCR heater assembly, and determining the observed characteristic can include determining the observed characteristic during the startup period of the PTCR heater assembly.

The startup period can be a range of time from about zero to five seconds after providing the input voltage to the PTCR heater assembly.

Determining the observed characteristic can include determining the observed characteristic diagnostically in a bench test.

Determining the observed characteristic can include determining the observed characteristic prognostically when the PTCR heater assembly is installed on an aircraft or vehicle.

Assessing the health status of the PTCR heater assembly can include calculating a percent deviation from the baseline characteristic based on a difference between the observed characteristic and the baseline characteristic.

The method can include outputting a notification if the observed characteristic exceeds a threshold percent deviation from the baseline characteristic.

While the invention has been described with reference to an exemplary embodiment(s), it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment(s) disclosed, but that the invention will include all embodiments falling within the scope of the appended claims.

The invention claimed is:

1. A system for determining a health status of a positive temperature coefficient resistor (PTCR) heater assembly, the system comprising:
   a PTCR heater assembly, wherein an input voltage is provided to the PTCR heater assembly to provide heating; and
   a health monitoring system comprising:
      a first sensor configured to sense the input voltage at the PTCR heater assembly; and
      a second sensor configured to sense a current through the PTCR heater assembly;
   wherein the health monitoring system is configured to determine a baseline characteristic and an observed characteristic each relating to an inrush peak of the PTCR heater assembly and based on the input voltage and the current; wherein the health monitoring system compares the observed characteristic to the baseline characteristic to assess a health status of the PTCR heater assembly; and wherein the health monitoring system outputs the health status for PTCR heater assembly diagnostics and/or prognostics.

2. The system of claim 1, wherein the baseline characteristic is a baseline time and the observed characteristic is an observed time.

3. The system of claim 1, wherein the baseline characteristic is a baseline change in current over change in time comprising a first baseline slope before the inrush peak and a second baseline slope after the inrush peak, and the observed characteristic is an observed change in current over change in time comprising a first observed slope before the inrush peak and a second observed slope after the inrush peak.

4. The system of claim 1, wherein the baseline characteristic is a baseline change in power over change in time comprising a first baseline slope before the inrush peak and a second baseline slope after the inrush peak, and the observed characteristic is an observed change in power over change in time comprising a first observed slope before the inrush peak and a second observed slope after the inrush peak.

5. The system of claim 1, wherein the baseline characteristic is a baseline magnitude of the inrush peak and the observed characteristic is an observed magnitude of the inrush peak.

6. The system of claim 1, wherein the baseline characteristic is a baseline area under the curve and the observed characteristic is an observed area under the curve.

7. The system of claim 1, wherein the PTCR heater assembly further comprises an array of PTCR heating elements.

8. The system of claim 1, wherein the health monitoring system further comprises a third sensor configured to sense a starting temperature of the PTCR heater assembly.

9. A system for an aircraft, the system comprising:
   an air data probe that includes a positive temperature coefficient resistor (PTCR) heater assembly, wherein an input voltage is provided to the PTCR heater assembly to provide heating for the air data probe; and
   a health monitoring system comprising:
      a first sensor configured to sense the input voltage at the PTCR heater assembly; and
      a second sensor configured to sense a current through the PTCR heater assembly;
   wherein the health monitoring system is configured to determine a baseline characteristic and an observed characteristic each relating to an inrush peak of the PTCR heater assembly and based on the input voltage and the current; wherein the health monitoring system compares the observed characteristic to the baseline characteristic to assess a health status of the PTCR heater assembly; and wherein the health monitoring system outputs the health status for PTCR heater assembly diagnostics and/or prognostics.

10. The system of claim 9, wherein the baseline characteristic is a baseline time and the observed characteristic is an observed time.

11. The system of claim 9, wherein the baseline characteristic is a baseline a baseline magnitude of the inrush peak and the observed characteristic is an observed magnitude of the inrush peak.

12. A method for determining a health status of a positive temperature coefficient resistor (PTCR) heater assembly, the method comprising:
   providing an input voltage to the PTCR heater assembly;
   sensing the input voltage at and a current through the PTCR heater assembly;
   determining a baseline characteristic relating to an inrush peak of the PTCR heater assembly and based on the input voltage and the current;
   determining an observed characteristic relating to the inrush peak of the PTCR heater assembly and based on the input voltage and the current;
   comparing the observed characteristic to the baseline characteristic;
   assessing a health status of the PTCR heater assembly based on the observed characteristic and the baseline characteristic; and
   outputting the health status for PTCR heater assembly diagnostics and/or prognostics.

13. The method of claim 12, wherein the baseline characteristic is a baseline time and the observed characteristic is an observed time.

14. The method of claim 12, wherein the baseline characteristic is a baseline change in current over change in time and the observed characteristic is an observed change in current over change in time.

15. The method of claim 12, wherein the baseline characteristic is a baseline change in power over change in time and the observed characteristic is an observed change in power over change in time.

16. The method of claim 12, wherein determining the baseline characteristic further comprises determining the baseline characteristic during a startup period of the PTCR heater assembly, and wherein determining the observed characteristic further comprises determining the observed characteristic during the startup period of the PTCR heater assembly.

17. The method of claim 12, wherein determining the observed characteristic further comprises determining the observed characteristic diagnostically in a bench test.

18. The method of claim 12, wherein determining the observed characteristic further comprises determining the observed characteristic prognostically when the PTCR heater assembly is installed on an aircraft or vehicle.

19. The method of claim 12, wherein assessing the health status of the PTCR heater assembly further comprises calculating a percent deviation from the baseline characteristic based on a difference between the observed characteristic and the baseline characteristic.

20. The method of claim 19, further comprising outputting a notification if the observed characteristic exceeds a threshold percent deviation from the baseline characteristic.

* * * * *